(12) United States Patent
Coteus et al.

(10) Patent No.: US 11,342,697 B2
(45) Date of Patent: May 24, 2022

(54) DUAL-LEVEL PAD CARD EDGE SELF-GUIDE AND ALIGNMENT OF CONNECTOR

(71) Applicant: International Business Machines Corporation, Armonk, NY (US)

(72) Inventors: Paul W Coteus, Yorktown, NY (US); Thomas Cipolla, Katonah, NY (US); Kyu-hyoun Kim, Chappaqua, NY (US); Edmund Blackshear, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 16/892,426

(22) Filed: Jun. 4, 2020

(65) Prior Publication Data

US 2021/0384661 A1  Dec. 9, 2021

(51) Int. Cl.
| | |
|---|---|
| *H01R 12/72* | (2011.01) |
| *H05K 3/00* | (2006.01) |
| *H05K 1/18* | (2006.01) |
| *H01R 12/70* | (2011.01) |

(52) U.S. Cl.
CPC ....... *H01R 12/722* (2013.01); *H01R 12/7011* (2013.01); *H05K 1/181* (2013.01); *H05K 3/0017* (2013.01); *H05K 2201/10189* (2013.01)

(58) Field of Classification Search
CPC .. H01R 12/7011; H01R 12/722; H05K 1/181; H05K 2201/10189; H05K 3/0017
USPC .......................................................... 174/261
See application file for complete search history.

(56) References Cited

U.S. PATENT DOCUMENTS

| | | | |
|---|---|---|---|
| 5,236,372 | A | 8/1993 | Yunoki et al. |
| 6,295,209 | B1 | 9/2001 | Farnworth et al. |
| 6,851,953 | B2 | 2/2005 | Kamiyamane |
| 8,337,243 | B2 | 12/2012 | Elkhatib et al. |
| 9,313,891 | B2 | 4/2016 | Jung et al. |
| 9,814,140 | B2 | 11/2017 | Beaman |
| 2007/0099443 | A1 | 5/2007 | Pax |

FOREIGN PATENT DOCUMENTS

EP          0557081         8/1993

*Primary Examiner* — Tremesha S Willis
(74) *Attorney, Agent, or Firm* — Daniel P. Morris; Gail Zarick; Lou Percello, Attorney, PLLC

(57) ABSTRACT

A card, e.g. a printed circuit board (PCB), has one or more conductive layers and one or more non-conductive layers disposed and alternating upon one another to form a stack. One or more of the conductive layers has one or more wiring elements within the conductive layer. The PCB/card has one or more card edges. The PCB also has a plurality of dual-level pad structures on each of one or more of the card edges. The dual-level pad structures each have an upper level, a lower level, and two or more walls. The lower level is a conductive pad with conductive surface. At least one of the conductive pads electrically connects to one or more of the wiring elements and/or one or more vias. In each of the dual-level pad structures, the walls and upper level may be made of an electrically non-conductive, insulating, or dielectric material or may be covered with a conductive material that electrically connects to conductive surface. There are different non-limiting embodiments of the structures and methods of making the structures.

20 Claims, 13 Drawing Sheets

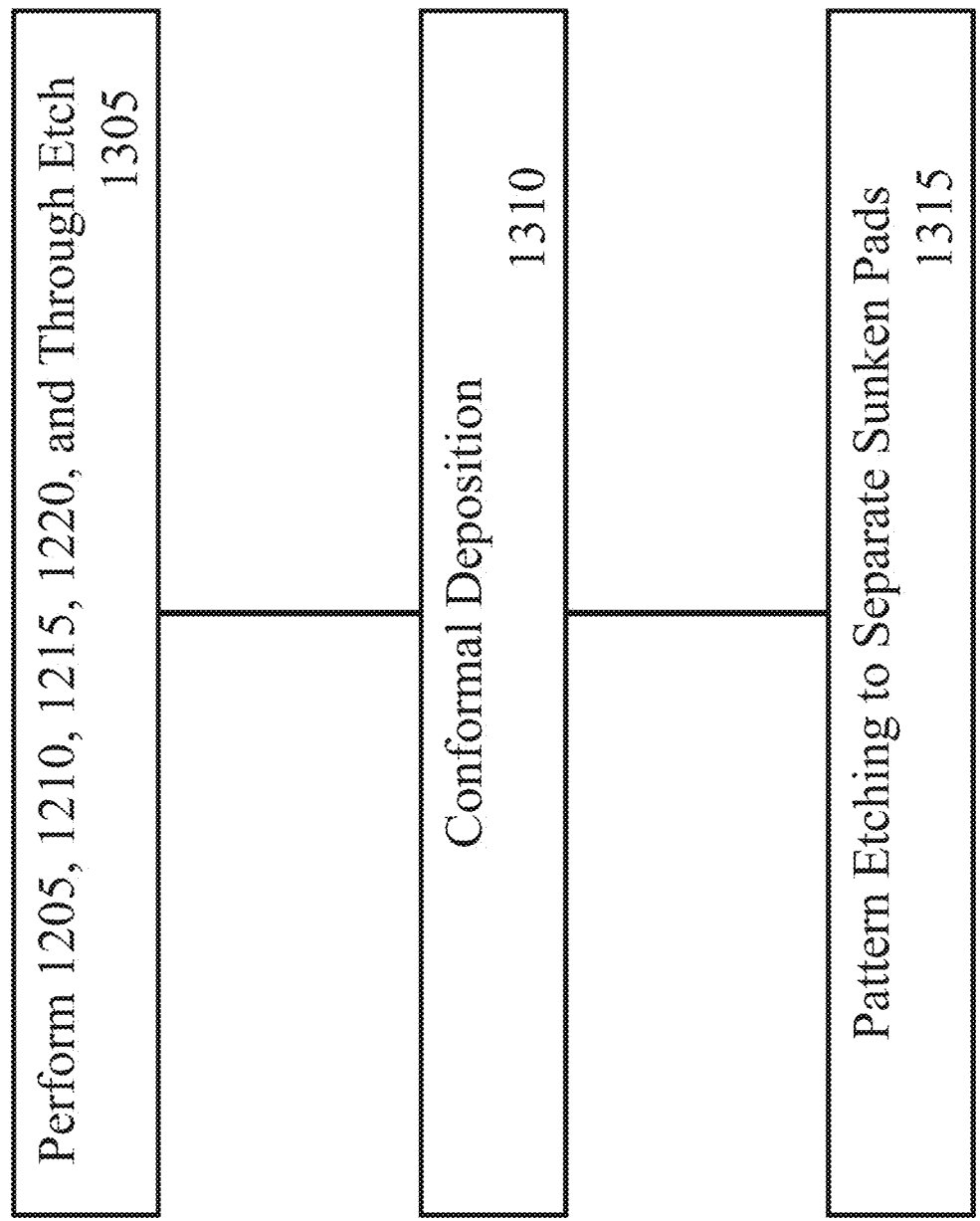

DUAL-LEVEL PAD CARD EDGE SELF-GUIDE AND ALIGNMENT OF CONNECTOR

BACKGROUND

The present invention relates organic substrates, e.g. cards or circuit boards (boards), that carry and connect electronic components. More specifically, the invention relates to connection and alignment of external connectors and connector pins to the card/board edge connections.

Cards, circuit boards, or printed circuit boards (PCBs) are used to carry electronic components, interconnect these components together, and connect those components to external circuitry. The cards are made of one or more non-conductive layers of fiber reinforced organic or resin material, like fiber glass or FR4. In some cases, one or more metal and/or metal interconnection layers are alternately layered with one or more of the non-conductive layers one upon another. One or more electronic components are mounted on and/or within the layers. The conductive layers typically can be patterned to make wiring elements, e.g. connections between the components. The conductive layers can also have conductive areas that provide voltage and ground planes. Vias through one or more of the layers can provide connections between wiring elements and/or planes in different conductive layers.

External connections can be made to wiring elements and components on the card through one or more card edges. In some embodiments, one or more card edges has a plurality of flat, metallized regions that form pad-like card edge pads (edge pads or pads) on one or more of the card edges. The pads are made of a conductive material like copper, nickel, titanium, aluminum, platinum, tungsten, silver, or gold and can plate one or both sides of the card edge. The pads can have a pitch between 0.5 millimeters (mm) to 3 mm. As circuits on the cards become denser, the pitch will decrease below 0.5 mm.

The card edge plugs into or is inserted into an external connector or connector. In some embodiments, the connector has a slot with a plurality of slot connections. In some embodiments, the slot connectors are pins and/or spring-like (slot) connections. In these embodiments, the card edge is inserted into the connector slot, force fitting the pads in contact with the slot connections. Accordingly, inserting the card edge into the connector (slot) causes each card edge pad to make physical and electrical contact with a corresponding/associated slot connection. Cards, card edges, pads, connectors, and slots are well known and are generally used to connect larger cards/boards with specific smaller cards. For example, a graphics card or dual in-line memory modules, DIMMs, inserts into a mother board and/or a mother board or one or more server boards inserts into a server back plane, etc.

Failures occur when one or more of the slot connections and/or pads are misaligned, i.e. when one or more of the card pads becomes physically and electrically disconnected from the corresponding/associated slot connection or a pad or pin (slot connector) shorts to another connection. This can occur when the card edge is initially inserted into the slot because one or more of the pads does not make physical contact with the corresponding slot connection or is misaligned. Short circuits and disconnections due to misalignments can occur during operation as a result of environmental factors like vibration and thermal cycling.

As the dimensions, e.g. pitch, of the pads decreases to accommodate more connections, the pad and slot connection size decrease and the likelihood of misalignment and operational failures increase. There is a need to improve the alignment and connection between pads on edge connectors and slot connectors within slots of connectors.

SUMMARY

A card, e.g. a printed circuit board (PCB), has one or more conductive layers and one or more non-conductive layers disposed and alternating upon one another to form a stack. One or more of the conductive layers has one or more wiring elements within the conductive layer. The PCB/card has one or more card edges. The PCB also has a plurality of dual-level pad structures on each of one or more of the card edges. The dual-level pad structures each have an upper level, a lower level, and one or more walls. The lower level is a conductive pad with conductive surface. At least one of the conductive pads electrically connects to one or more of the wiring elements and/or one or more vias. In each of the dual-level pad structures, the walls and upper level may be made of an electrical non-conducting, insulating, or dielectric material or may be covered with a conductive material that electrically connects to conductive surface.

There are different embodiments of the dual-level pad structures. For example, the dual-level pad structures can be in the form of grooves with the walls a uniform distance apart or with the walls a non-uniform distance apart, e.g. the distance decreases as the groove is traversed from a periphery of the card edge inwardly toward the card/PCB creating a tapered groove. The dual-level pad structure can also take the form of a sunken pad.

Electrical connections between the dual-level pad structure and external connections, e.g. pins, are disclosed along with methods of making these and other non-limiting structures. Pins with a pitch of 0.5 millimeters or less can be aligned and connected to corresponding/associated dual-level pad structures.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

FIG. 13 is a flow chart showing the additional steps of forming a sunken pad edge connector.

DETAILED DESCRIPTION

Figure 1:
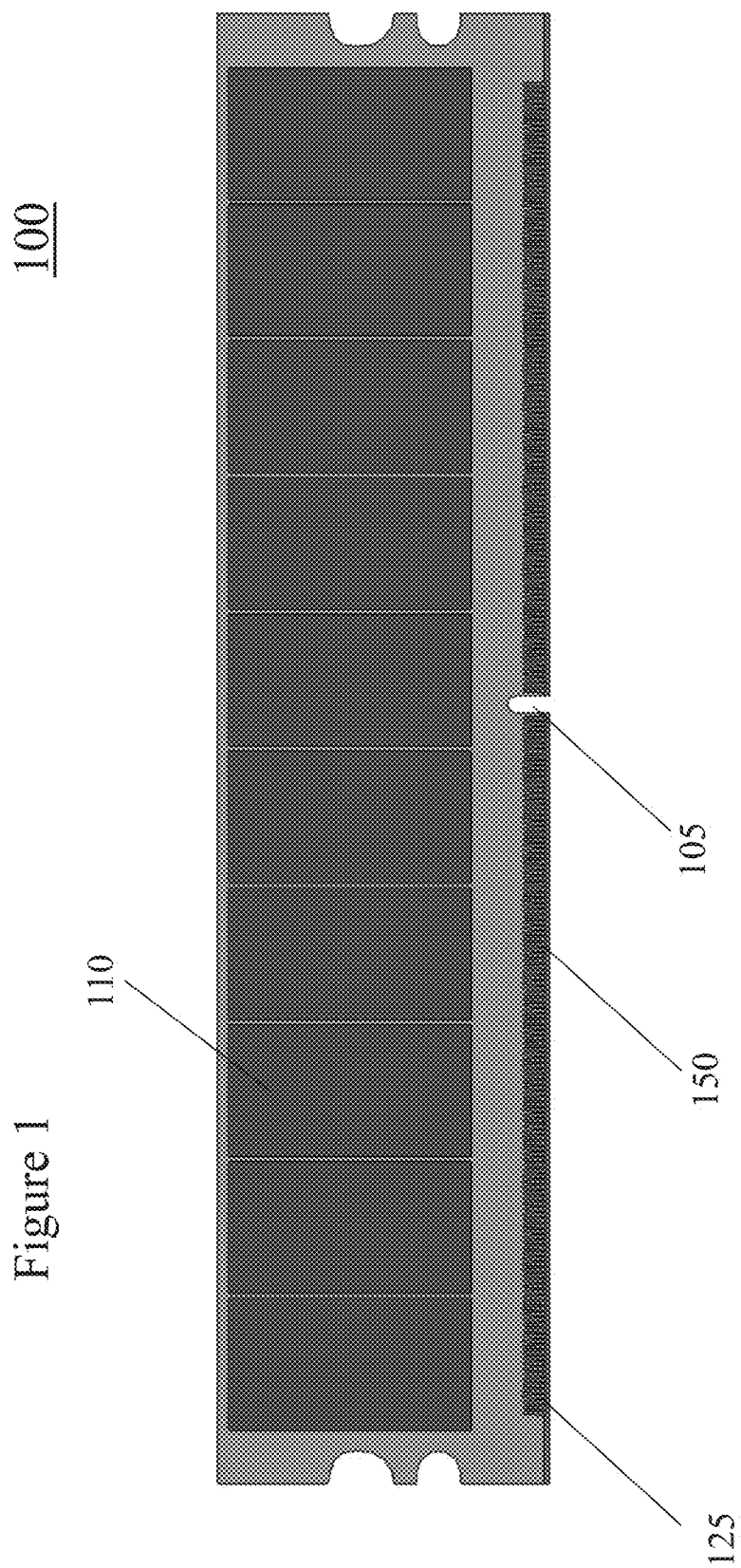
FIG. 1 is a block diagram of a card, e.g. a printed circuit board, with one or more circuits/components and an edge connector with a plurality of pads.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

A card edge with pad connections is widely used to connect a card or module (e.g., a dual in-line memory module, DIMM) to other components, e.g. a mother board or back plane. As bandwidth of the communication through the card edge becomes higher and higher, the number of connector pads also grows. However, the width of the card edge, i.e. the width of the card/module, is difficult to grow commensurately because of limitations of the board/card layout and board/card form factor. Therefore, to accommodate the increased number of pads, the pitch of pads on the card edge decreases. As the pad pitch on the card edge becomes smaller, the alignment between each pad and a (slot) connection, e.g. a pin in an external connector, becomes more difficult. Unless alignments are tightly controlled, misalignments can result in signal/power shorts, like short connections of a pin to a wrong pad or pin to pin. Because the horizontal alignment tolerances are reduced by an increased number of pads on a relatively fixed physical card edge dimension, better pad/pin alignment structures are needed.

This invention proposes alternative self-guiding three-dimensional structures on card/module (PCB) edge(s) to self-align the pins of the connector to correctly align, guide, and/or position each pin on the connector to the corresponding/associated pad on the card edge when the card is inserted into the connector. The structure also guarantees the physical separation of pins. These self-guiding structures can align pads with spacing/pitch less than 0.5 mm.

The self-guiding structures are dual-level, self-guiding pad structures on the card edge. Three different embodiments of dual-level, self-guiding pad structures include: 1. a grooved guide and 2. a grooved guide that is tapered, i.e., the groove decreases in width further from the card edge, and 3. a sunken pad guide.

Refer to the Figures.

FIG. 1 is a block diagram of a card, e.g. a PCB card, 100 with one or more circuits/components 110 and one or more edge connectors 125 each with a plurality of dual-level pads 150, shown in more detail below. Typically, the pads 150 have a pitch, or center to center spacing of 3 millimeters (mm) or less. More typically, the pitch is less than 0.5 mm. Indentation 105 can be used for coarse alignment of the card 100.

Figure 2:
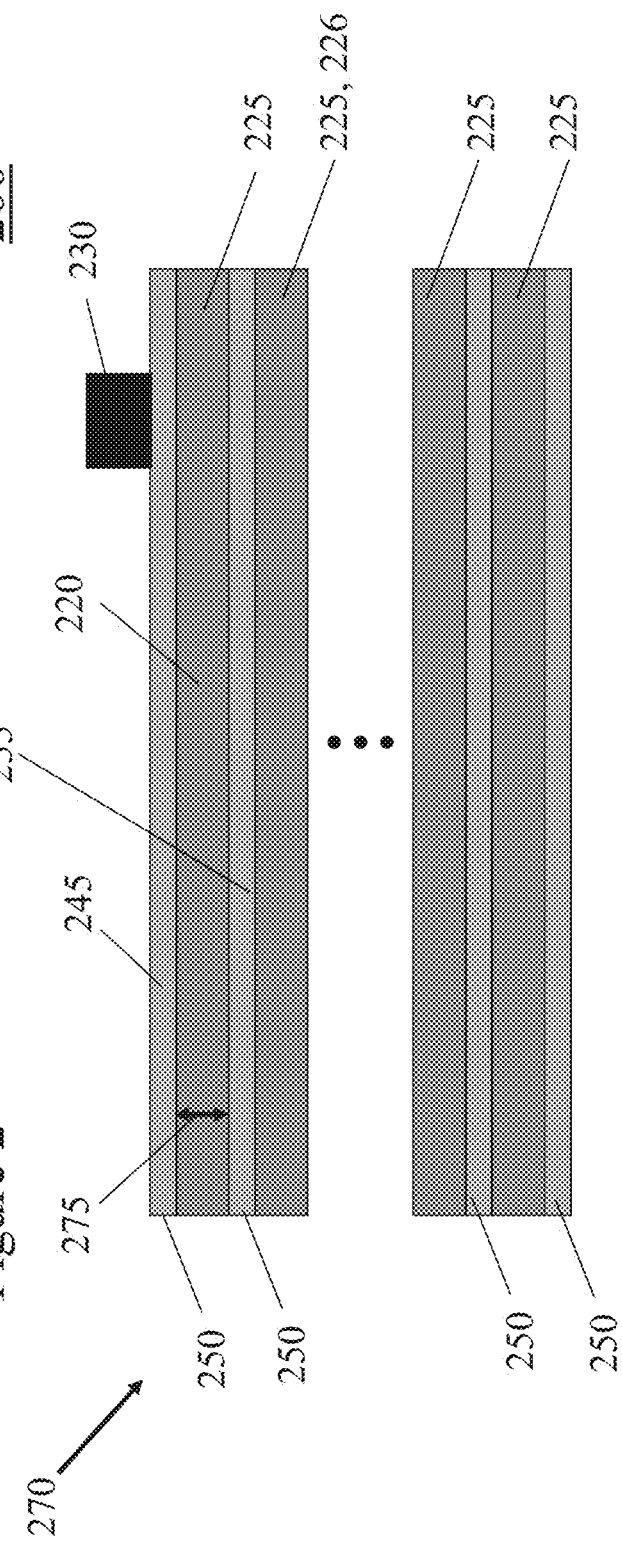
FIG. 2 is a block diagram of one or more conducting and non-conducting layers alternating one upon the other in a stack to make up the card.

FIG. 2 is a block diagram of one or more conducting 250 and non-conducting 225 layers, alternating one upon the other in a stack 270 to make up the card 200.

The conductive layers 250 are made of a conductive material, e.g. a metal like copper, nickel, silver, or gold. The conductive material is disposed on the non-conductive layers 225 using known methods, e.g. an additive etch like plating or a pattern-etch (subtractive etch) of an adhered conductive sheet. The conductive layers 250 include areas of patterned conductive material. For example, the patterns include wiring elements, e.g. connections between components 230, and planar areas, e.g. voltage and ground planes.

Components 230 can include any active or passive electrical component including semiconductor chips (like dual in-line memory modules (DIMMs) or processing units), capacitors, transistors, inductors, etc. In some embodiments, components 230 can be mounted within the layers, e.g. 225. Vias (not shown) can pass between the layers, e.g. in a vertical direction to make connections at different layers. In some embodiments, these vias are plated or otherwise made conducting and may be through-vias (meaning they go all the way through the card), or blind vias (meaning they start at the top or bottom surface of the card but do not penetrate all the way through the card), or buried vias (meaning they are wholly between layers within the card).

The non-conductive layers 225 are made of non-conductive material like fiber reinforced organic or resin material, FR4, etc.

The conductive layer 250 at the top of the stack 270 is a top conductive layer (250, 245) or first conductive layer 245. The next layer down 220, e.g. a non-conductive layer 225, is defined as the first non-conductive layer (225, 220).

The next lower conductive layer (250, 255) is the second conductive layer 255. The conductive layers 250 and non-conductive layers 225, respectively, are thus consecutively numbered as the stack 270 is traversed from top to bottom. To continue the example, the second non-conductive layer (225, 226) is the second non-conductive layer 225 from the top of the stack 270.

Any conductive layer 250 that is lower in the stack 270 than the top conductive layer (250, 245) is an underlayer or underlying conductive layer, typically 255.

The first non-conductive layer (225, 220) has a thickness 275. In one embodiment, as described below, groove guides are formed by through (or stop) etching through the top or first conductive layer (250, 245) as a mask and the top or first non-conductive layer (225, 220). Therefore, the thickness 275 of the top non-conductive layer (225, 220) will determine the depth of the groove guides.

Figure 3:
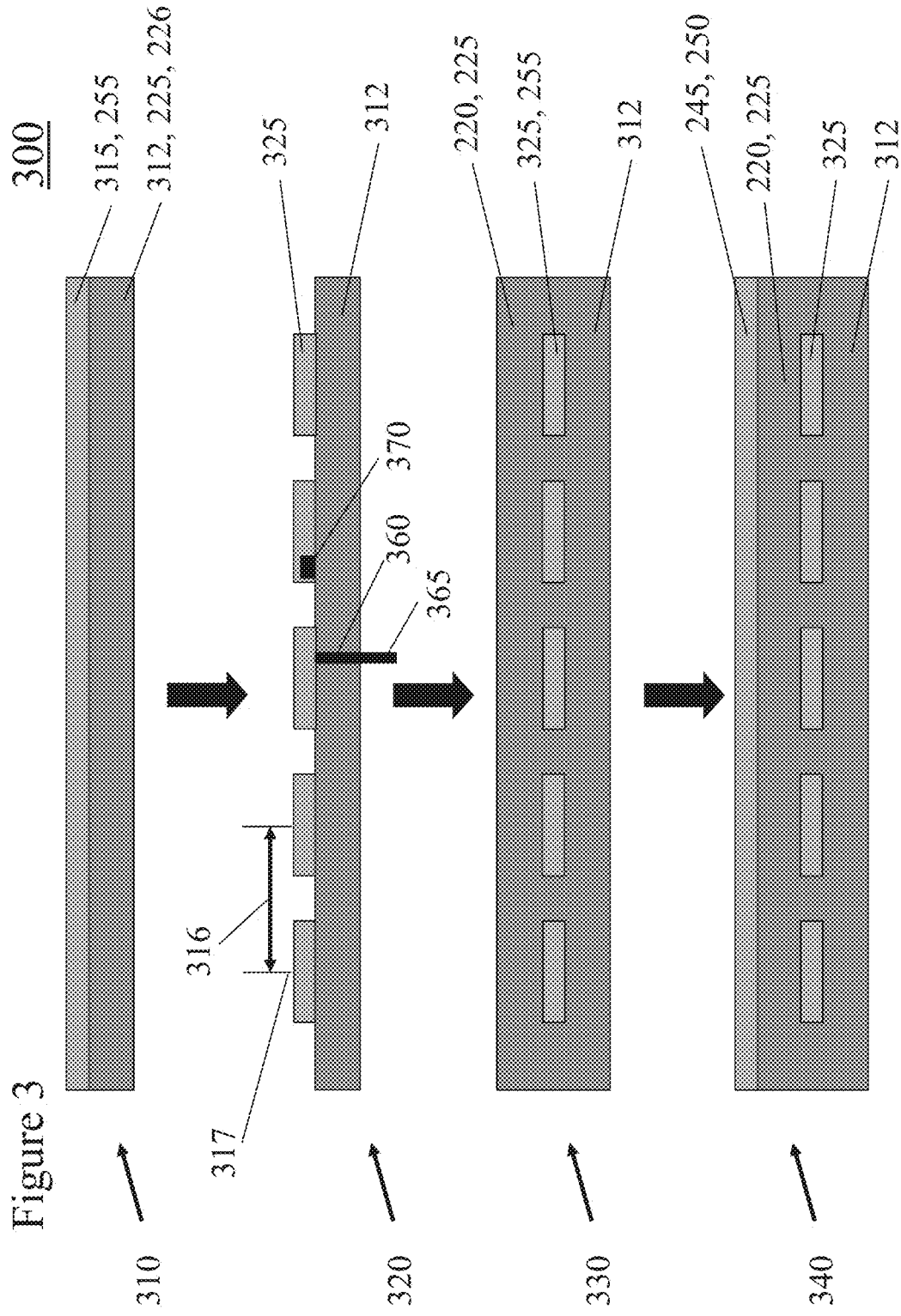
FIG. 3 is a sequence of block diagrams representing structures showing steps of a groove guide formation process.

FIG. 3 is a sequence (310, 320, 330, 340) of block diagrams representing structures showing steps of a groove guide formation process 300.

The process 300 begins with structure 310, shown as a partial elevation view of the stack 270, with the second conductive layer (315, 255) disposed on the second non-conductive layer (225, 312, 226). The remaining underlayers (225, 250) in the stack 270 are not shown in structure 310 for clarity. The top conductive layer (250, 245) and the top non-conductive layer (225, 220) are not yet made in this structure 310.

Structure 320 shows what remains 325 of the second conductive layer (315, 255) after a masked pattern etching (a second conductive layer pattern etching 320) of the second conductive layer 315. The etching leaves a pattern of conductive pads 325 spaced apart from one another. In some embodiments, the conductive pads 325 are not in electrical or physical contact with one another. In some embodiments, the conductive pads 325 have a uniform spacing, e.g. a center-to-center spacing, or pitch 326, that can be measured from the centers 317 of two adjacent conductive pads 325. In some embodiments, the conductive pads 325 are in electrical contact with one or more of the wiring elements in one or more of the conductive layers 250. For example, the conductive pads 325 connect to one or more wiring elements in the second conductive layer (315, 255) which in turn can connect through vias 360 to wiring elements in other conductive layers 250, e.g. the top conductive layer (250, 245), and/or components 230.

In some embodiments, one or more vias 360 (shown in structure 320 but omitted from other structures for clarity) connects to one or more conductive pads 325. For example, the via(s) 360 can pass through the second non-conductive layer (312) and could pass through 365 one or more other underlayers, typically 255. An example wiring element 370 connected to one or more of the conductive pads 325 is also shown.

Figure 12:
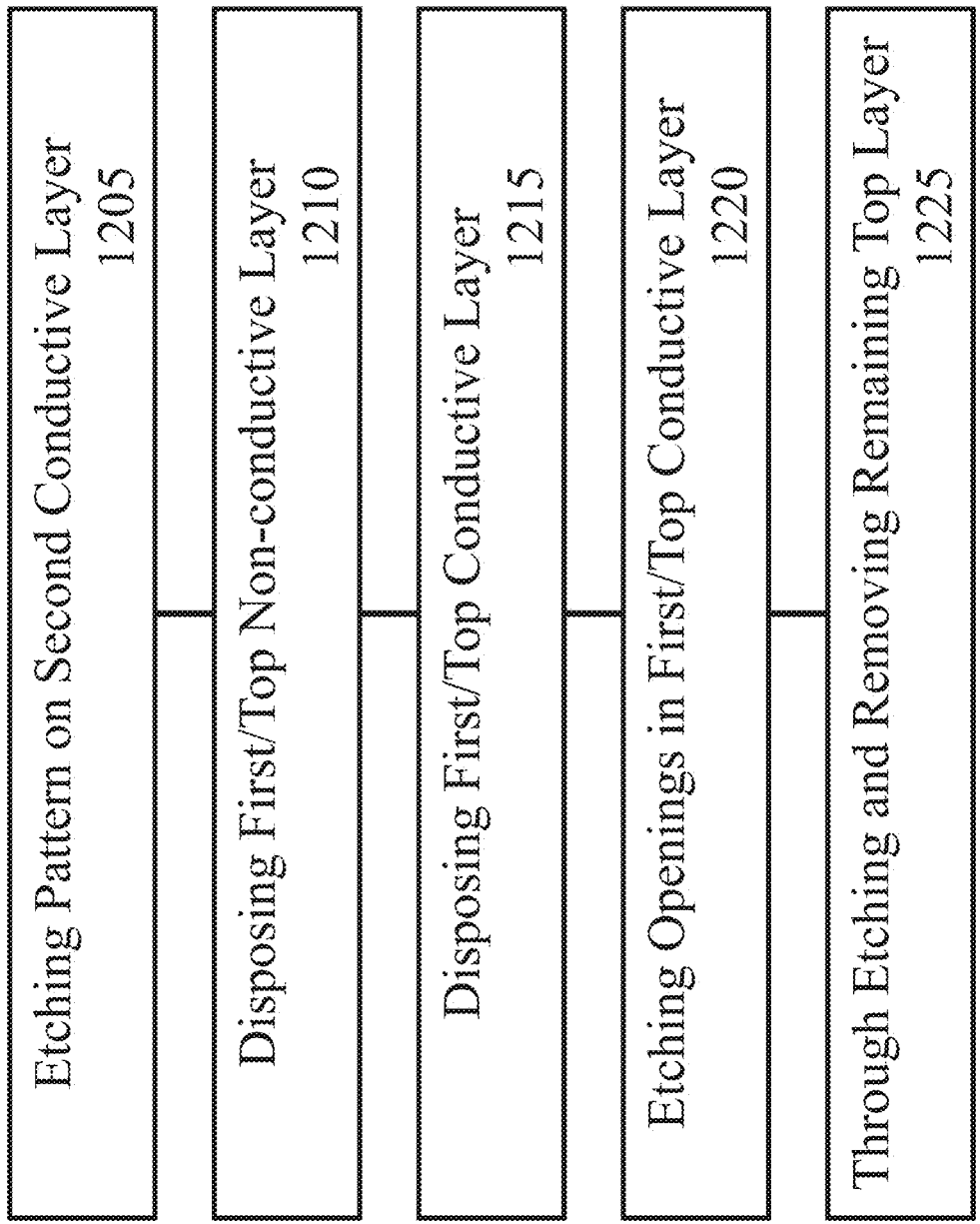
FIG. 12 is a flow chart showing the steps of forming a groove guided card edge connector.

Alternative methods of forming structure 320 are discussed in FIGS. 12 and 13.

Structure 330 is made by disposing the first or top non-conductive layer (225, 220) on the second non-conductive layer (225, 312) and the conductive pads 325 by using known techniques.

Structure 340 is made by disposing the first or top conductive layer (250, 245) on the top non-conductive layer (225, 220), e.g. by plating. In alternative embodiments, structure 310 is fused to structure 320 by heat and pressure, and then the top surface 245 is patterned by subtractive etch.

Figure 4:
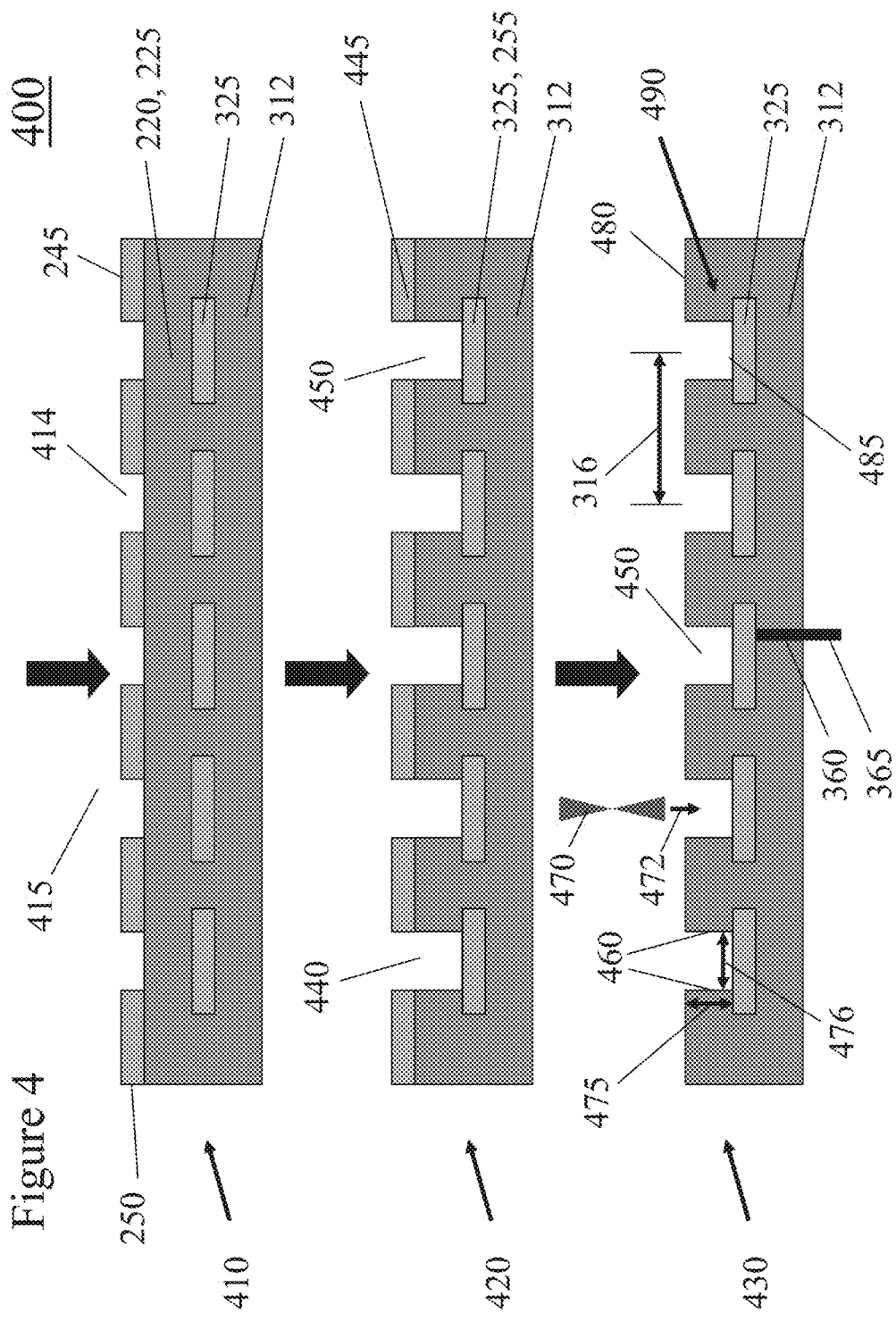
FIG. 4 is a sequence of block diagrams representing structures showing steps continuing the groove guide formation process.

FIG. 4 is a sequence (410, 420, 430) of block diagrams representing structures showing steps continuing the groove guide formation process 300.

Structure 410 is made by performing a masked pattern etch (a top conductive layer pattern etch 410) of the top conductive layer (250, 245). The top conductive layer pattern etch creates one or more openings 414 in the top conductive layer (250, 245). One or more of the openings 414 is over one of the conductive pads 325, e.g. the vertical projection of one of the openings 414 is over one of the conductive pads 325. Accordingly, the top conductive layer pattern etch 410 creates a top pattern 415 in the top conductive layer (250, 245). In some embodiments, the openings 414, i.e. the vertical projection of the openings 414 do not extend outside the surface area of the conductive pad 325 under the respective opening 414.

Structure 420 is made by a through etch 420 or a etch-stop masking technique 420 of structure 410. The etch chemistry of the through etch 420 is such that the material making the top pattern 415 (and conductive pads 325) is etched minimally, or not at all, and the material in the top non-conductive layer (225, 220) is etched away 440 where exposed 440 to the through etch 420 through the top pattern 415. The etching stops at conductive pads 325. In other words, the top pattern 415 serves as a mask for the through etch 420 or etch-stop masking technique 420.

The through etch 420 exposes the conductive surface of the conductive pads 325 which are now in an underlayer (typically 255) of the stack 270. In this case the conductive pads 325 are located in the second conductive layer (255, 315). Accordingly, electrical contact can be made to the wiring elements 370 in the stack 270 through the conductive pads 325 on/in one of the underlayers, typically 255. In some embodiments, the top pattern and through etch 420 does not expose the conductive pads 325 outside of the cross-section surface area of the respective conductive pad 325 or exposes a lesser cross-surface of the conductive pad 325.

Structure 430 is created when the remainder of the top conductive layer (250, 245) is removed by known methods. In some embodiments, the top conductive layer (250, 245) is only removed in one or more areas on the top non-conductive layer (225, 220) that could come into electrical contact with an external connection. The removal of the top conductive layer (250, 245) can be performed with a masked etch so as not to remove the conductive pads 325.

A plurality of grooves 450 are now formed at one or more edges connectors 125 of the card 100. Each of one or more of the grooves 450 has a conductive pad 325 at the groove bottom. The conductive pads 325 can be connected to one or more of the wiring elements 370 in the stack 270. Each of the grooves 450 has non-conductive groove sides 460 that can align an external connection 470. The grooves 450 can have a pitch 316 of 0.5 mm or less. Thus, the grooves 450 are groove guides 450 that can align, guide, and position pins 470 of the connector (not shown) to be in contact with the conductive pad 325. In addition, since the groove guides 450 are made of the non-conductive material of the second non-conductive layer (220, 225), the groove guides 450 electrically isolate the inserted 472 pins 470 from electrically connecting with any contact other than the conductive pad 325 (the corresponding/associated conductive pad 325) at the bottom of the respective groove guide 450. Therefore, each pin 470 in the external connector contacts only the corresponding/associated conductive pad 325 and will not electrically or physically contact any other conductive pad 325 or other pin 470.

Each of the groove guides 450 has one or more groove walls 460 that guide the inserting 472 pin 470 and insulate the pin 470 from electrical contacts other than the corresponding/associated conductive pad 325 at the base of the groove guide 450. The groove guides 450 have a height or depth 475. By varying the thickness 275 of the first non-conductive layer (225, 220), the depth 475 is controlled. For example, the groove guide 450 associated with (e.g. connected to) a larger pin 470 size could have a deeper 475 groove guide 450 than a groove guide 450 associated with a smaller pin 470 size.

The groove guide 450 depth 475 range is limited only by the layer 312 thickness 275, but in some embodiments, the aspect ratio, or ratio of width 476 to depth 475, is in the range of 2:1 to 1:3. If the depth 475 is too shallow, the groove guide 450 may not be an effective guide, and if the depth 475 is too deep, the etching becomes more difficult. Also, the groove guide 450 depth 475 is chosen as trading off between keeping the depth 475 thick enough to keep the pins 470 from misaligning and/or electrically shorting while minimizing the total thickness of the stack 270.

Note that the groove guide 450 makes a dual-level (480, 485), self-guiding (460, 485) pad structure 490. The conductive pad 325 surface is at the groove guide 450 bottom 485 which is at a different level (lower underlayer) than the surface 480 of the card edge connector 125. Since there are two levels (480, 485), an upper level 480 and a lower level 485, of the dual-level pad 490, the groove guide walls 460 are created which, in this embodiment, align the pins 470 of the connector while electrically insulating the pins 470 from electrically connecting to other conductive pads 325 or pins 470. In other words, in this embodiment, there are a plurality of dual-level structures 490 each with a conductive pad 325 on the card edge 125 and each conductive pad 325 at an inner, lower, underlayer of the card 100 (e.g. at the groove guide 450 bottom 485) and where the dual-level structures 490 additional have insulating, dielectric walls 460 that electrically and physically shield and separate the conductive pads 325 and corresponding/associated pins 470 from other conductive pads 325 and pins 470. The self-guiding structure accommodates pad contact spacing of 0.5 mm or less, with precision alignment, at reduced cost.

In other words, in some embodiments, the walls 460, upper level 480, and conductive pad 325 of the dual-level pad structure (450, 490) in the associated connection form a groove 450 with a groove depth 475 and groove width 476. An external connection, e.g. a pin 470, in each associated connection with one of the grooves 450 is guided by the walls 460 to make contact with the conductive surface 485 of the conductive pad 325, e.g. by a force like a spring action insertion 472 of the pin 470. The pin 470 is electrically insulated from other electrical contacts, e.g. other conductive pads 325 or pins 470, by the non-conductive material making the walls 460 and upper level 480. Larger pins 470 (or other external connections 470) can require a deeper groove depth 475. In many embodiments, the pins 470 are within any well-known external connector (connector) and/or slot, e.g. within the connector (not shown).

Figure 5:
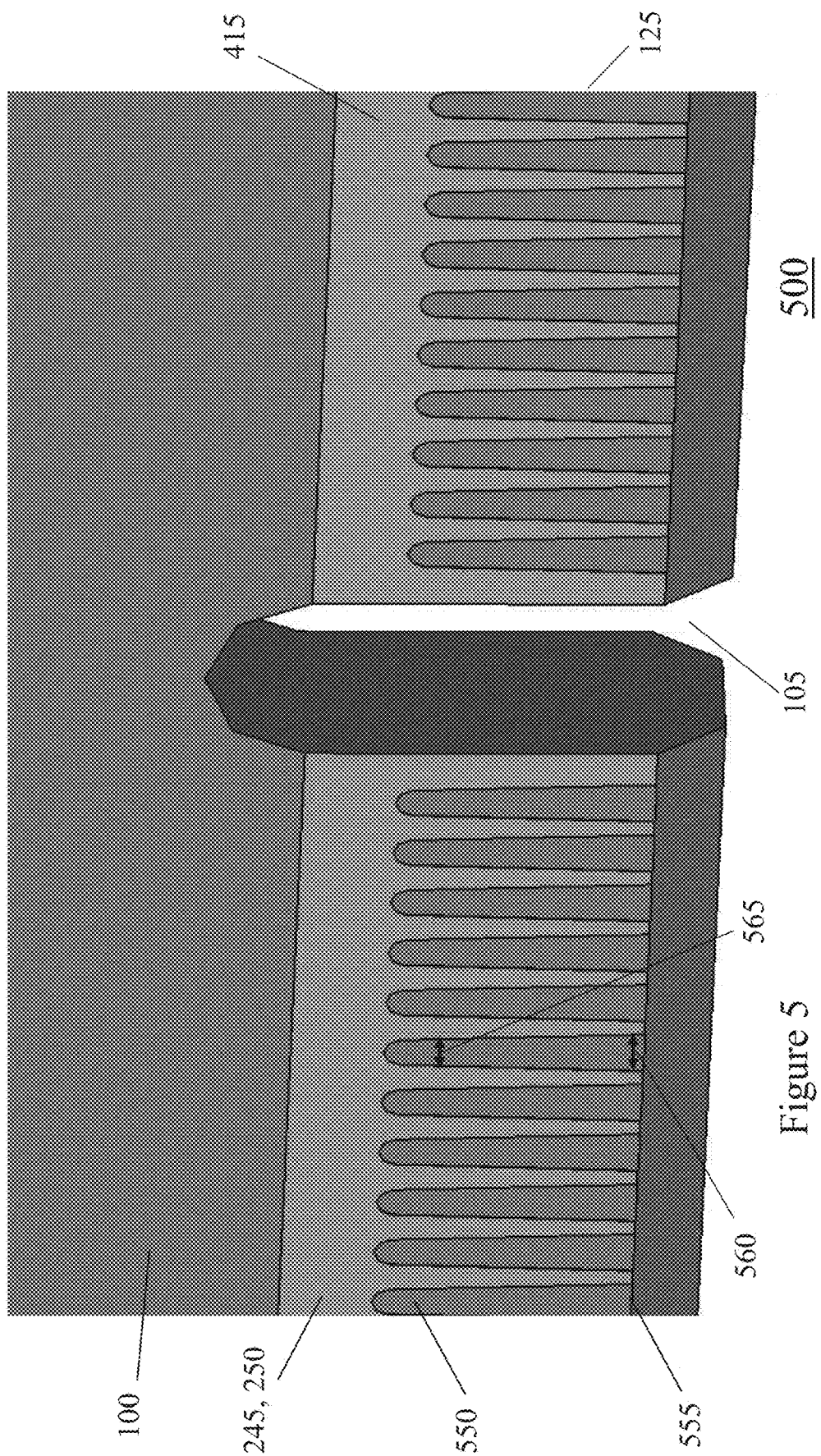
FIG. 5 is an isometric view of a card edge connector with a surface patterned metal layer.

FIG. 5 is an isometric view 500 of a card edge connector 125 with a surface patterned metal layer 415. An example of the isometric view 500 is the structure 410 after a top conductive layer pattern etch 410 patterns the top conductive layer (250, 245) before the conductive pads 325 are exposed on the underlayer 255. In some embodiments, the surface patterned metal layer 415 acts as a mask that determines the shape of the groove guide 450, e.g. the positions and shape of the groove guide walls 460.

For example, the surface patterned metal layer 415 can define and position a plurality of unmasked areas 550 that define the shape and location of the groove guide walls 460. Therefore, the unmasked areas 550 define a width (e.g. 560, 565) of the groove guide 450. Groove guide 450 width 560 is measured closer to the card edge connector 125 periphery 555 while groove guide 450 width 565 is measured further from the card edge connector 125 periphery 555.

Accordingly, by altering the surface pattern metal layer 415, e.g. the unmasked areas 550, the groove guide 450 can be changed. For example, if widths 560 and 565 are equal, the groove guide walls 460 made will be equidistant from one another. However, if the width 565 is smaller than the width 560, the groove guide walls 460 will be tapered, e.g. the groove guide walls will become closer to one another as the pin 470 traverses the groove guide 450 deeper into the groove guide 450 and further from the periphery 555.

An advantage of the equidistant width embodiment is that there will be less frictional resistance when the card 100 is inserted into the connector. An advantage of the tapered embodiment is that the pin 470 alignments will be more accurate.

Figure 6:
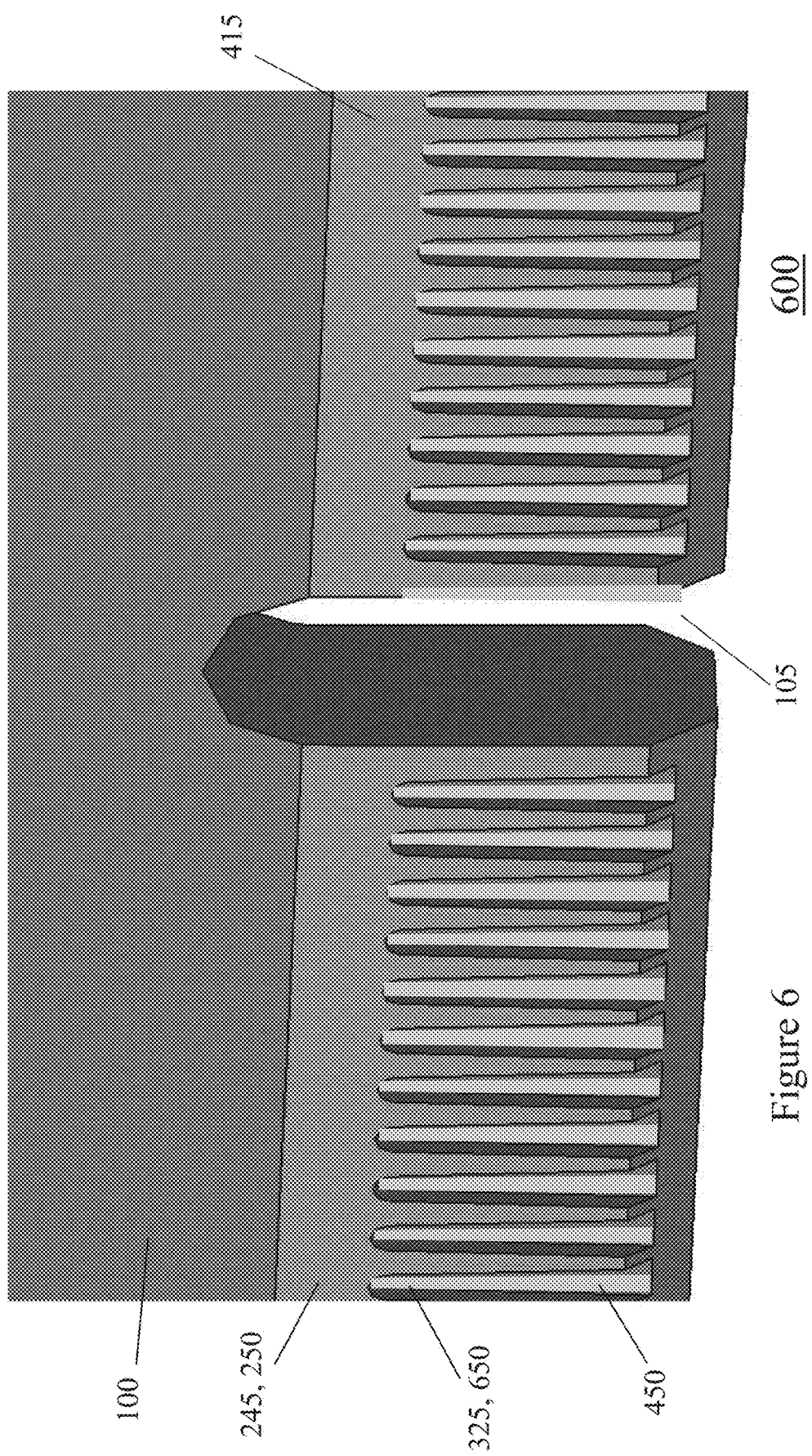
FIG. 6 is an isometric view of a card edge connector showing formation of a plurality of groove guides and a plurality of exposed underlayer pads.

FIG. 6 is an isometric view 600 of a card edge connector 125 showing formation of a plurality of groove guides 450 and a plurality of exposed underlayer pads (325, 650), e.g., conductive pads 325.

As described in the description of structure 420, the through/stop etch 420 uses the top pattern 415 as a mask to etched away 440 exposed material 440 in the first non-conductive layer (225, 220) to form the groove guides 450.

Some etch processes leave the bottom of the groove narrower than the top (under-etch), while some etch processes etch the bottom of the groove (i.e. deeper into the card) more than the top of the groove (over-etch). While these embodiments are contemplated, they are not preferred. Under-etching may not expose enough of the bottom pad while over-etching may result in the dielectric barrier detaching itself from the card.

Figure 7:
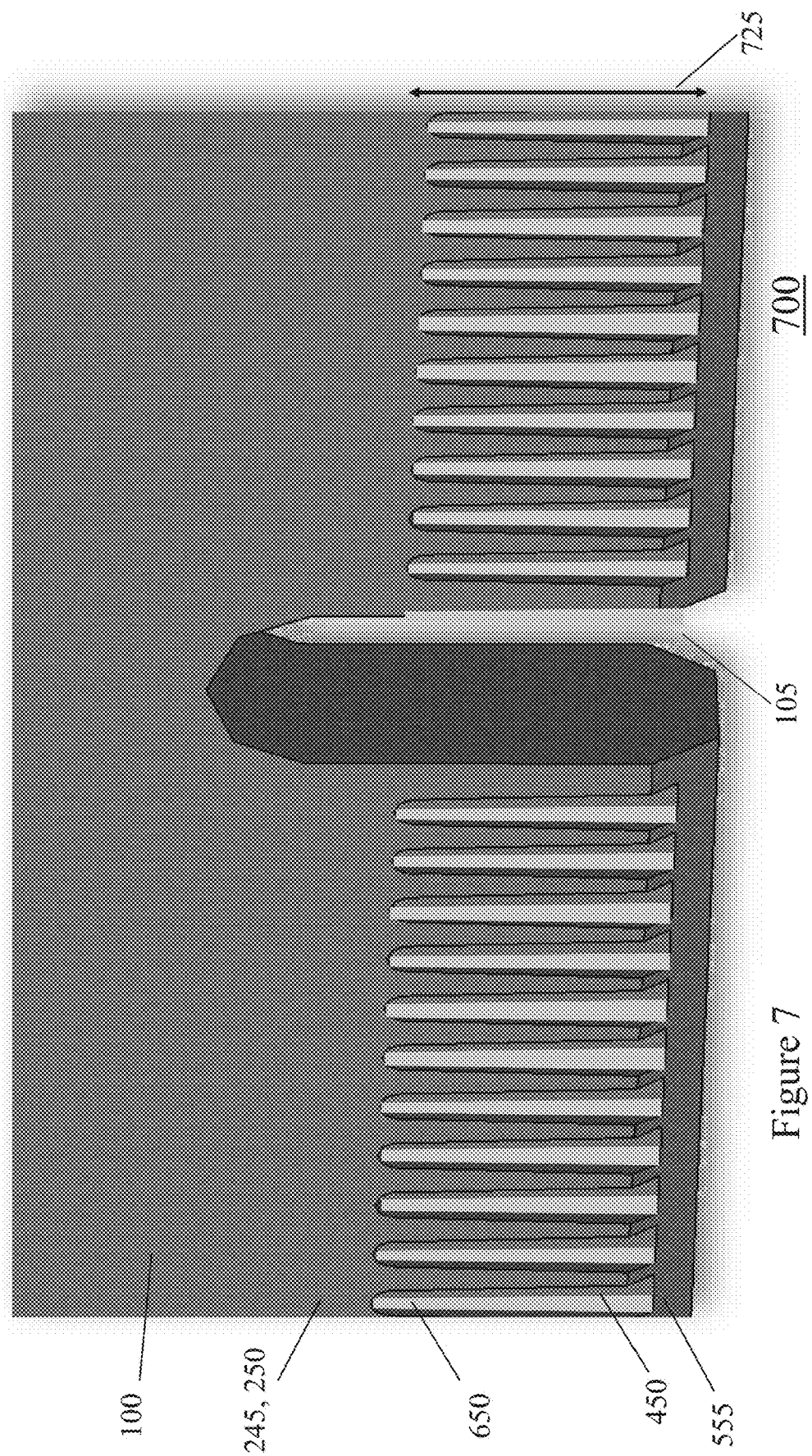
FIG. 7 is an isometric view of a card edge connector showing the groove guides, exposed underlayer pads, and the surface patterned metal layer removed.

FIG. 7 is an isometric view 700 of a card edge 125 connector 100 showing the groove guides 450 and exposed underlayer pads conductive pads (325, 650) with the surface patterned metal layer 415 removed. The surface patterned metal layer 415 is removed as explained in the description of structure 430 above.

In some embodiments, the surface patterned metal layer 415 is only removed in the region within the dimension 725 from the periphery 555 of the card edge connector 125. In this way, the conductive material in the top conductive layer (250, 245) is only removed from the region 725 of the card 100 where interference (e.g. electrical short connections) are possible with the pins 470 while conductive patterns, including wiring elements 370 and voltage/ground planes, are still permitted in the top conductive layer (250, 245) outside of region 725.

Figure 8:
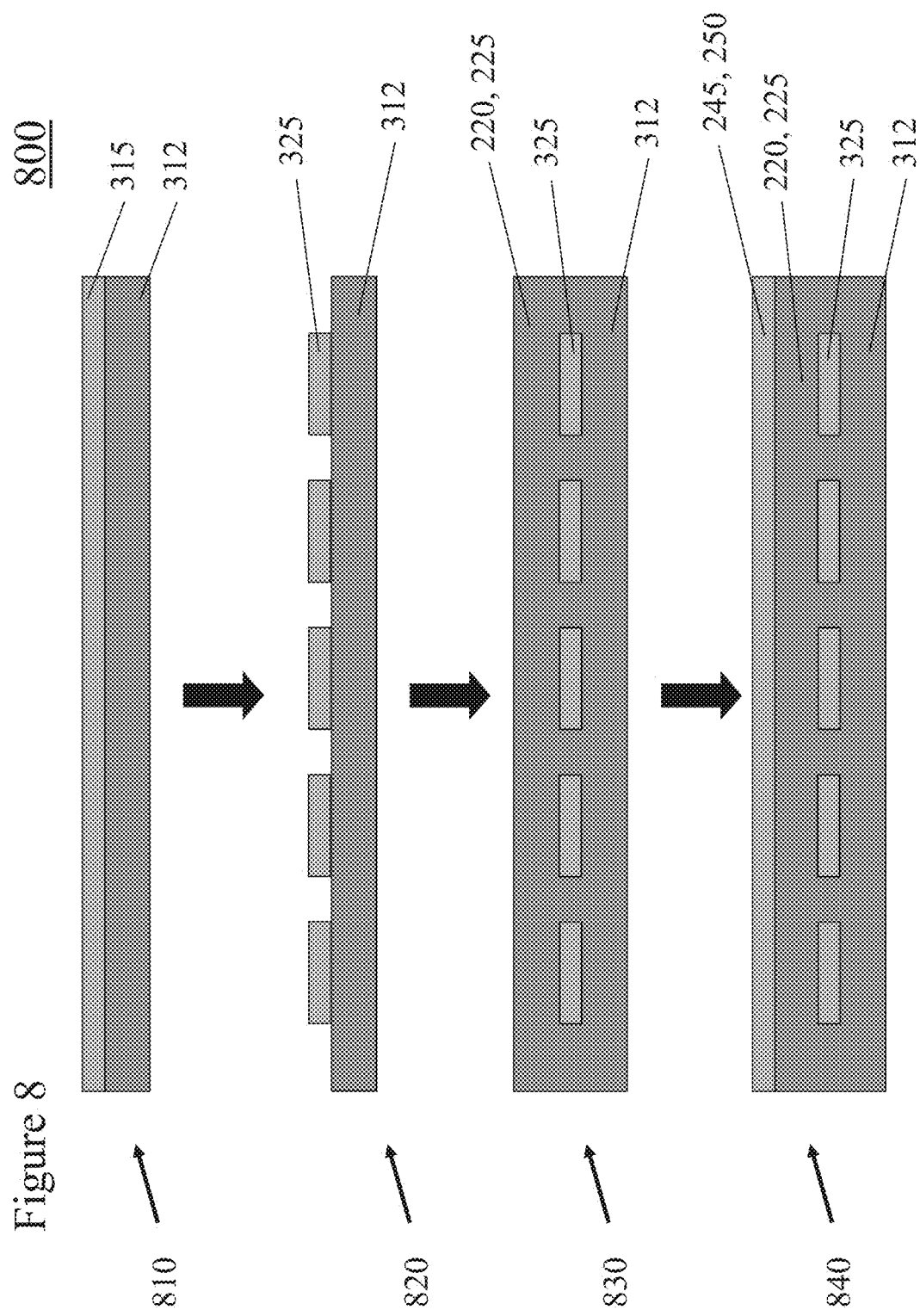
FIG. 8 is a sequence of block diagrams representing structures showing steps of a sunken pad formation process.

FIG. 8 is a sequence (810, 820, 830, 840) of block diagrams representing structures showing steps of a sunken pad formation process 800. The sunken pad formation process 800 forms a plurality of sunken pads (shown below in FIG. 9) that are an alternative embodiment of the dual-level, self-guiding pad structures on the card edge 125.

The sunken pad formation process 800 begins, as before 310, with the structure 810 which as before is a partial elevation view of the stack 270 with the second conductive layer (315, 255) disposed on the second non-conductive layer (225, 312, 226). The remaining underlayers (225, 250) in the stack 270 are not shown in structure 810 for clarity. The top conductive layer (250, 245) and the top non-conductive layer (225, 220) are not yet made in this structure 310.

Structure 820 is made, as before 320, with a masked pattern etching (a second conductive layer pattern etching 320) which creates a pattern of conductive pads 325.

Structure 830 is made, as before 330, by disposing the first or top non-conductive layer (225, 220) on the second non-conductive layer (225, 312) and the conductive pads 325 by using known techniques.

Structure 840 is made, as before 340, by disposing the first or top conductive layer (250, 245) on the top non-conductive layer (225, 220), e.g. by plating.

Figure 9:
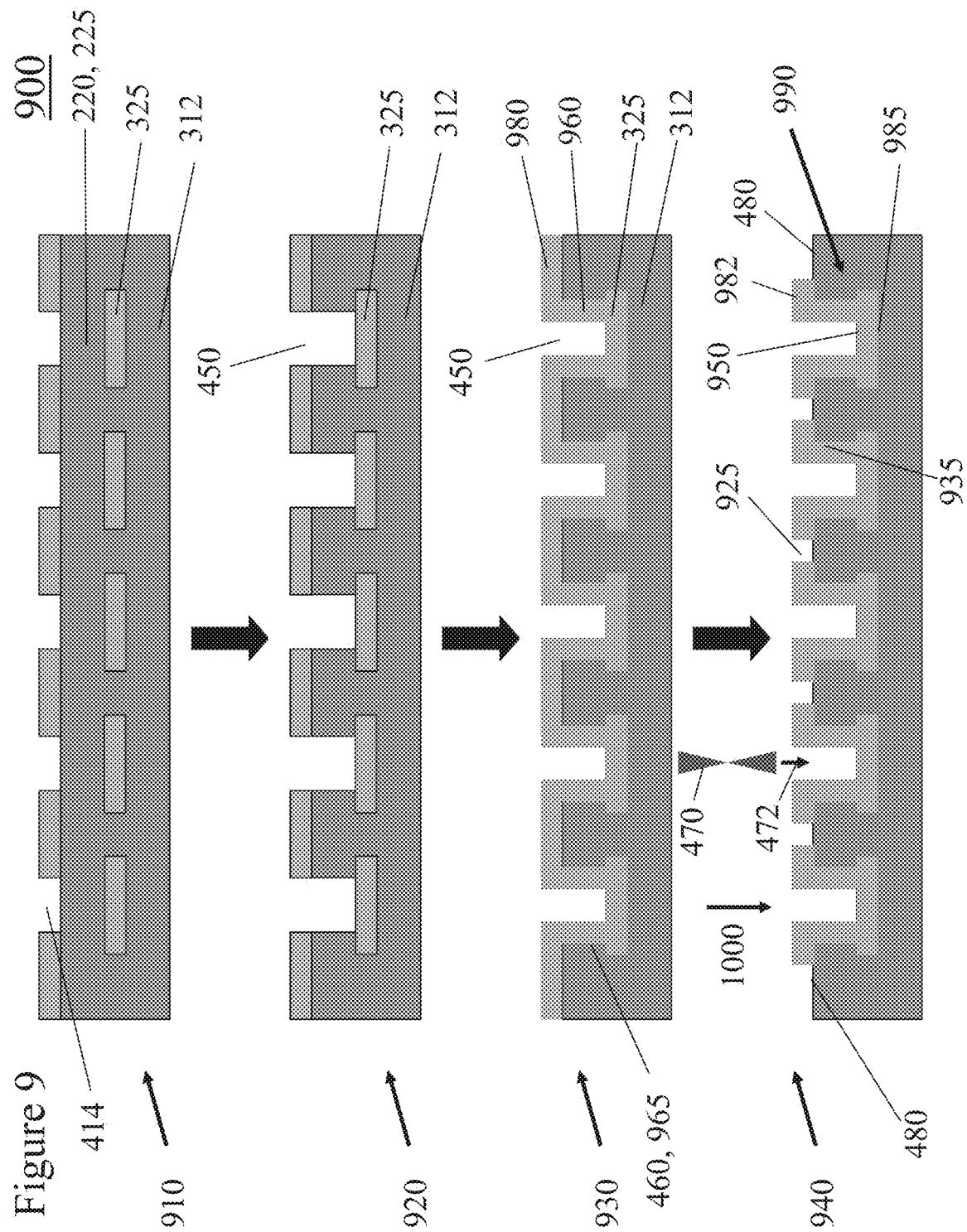
FIG. 9 is a sequence of block diagrams representing structures showing steps continuing the sunken pad formation process.

FIG. 9 is a sequence (910, 920, 930, 940) of block diagrams representing structures showing steps continuing the sunken pad formation process 800.

Structure 910 is made, as before 410, by performing a masked pattern etch (a top conductive layer pattern etch 410) of the top conductive layer (250, 245) to create one or more openings 414 in the top conductive layer (250, 245) in a top pattern 415. Structure 920 is made, as before 420, by performing a through/stop etch 420, exposing the surface of the conductive pads 325.

Structure 930 is made by performing a conformal deposition of a conductive layer on the surface 480 of the card edge connector 125. The conductive layer is made of any conductive material, e.g. metal, but in some embodiments is the same material making up the conductive pads 325, e.g. copper. The conformal deposition covers the top 480 of the card edge connector 125 (e.g. the top of the first non-conductive layer (225, 220) and the sides 460 of the groove guide 450 walls 460.

In some embodiments, the thickness of the conformal deposition is between 2 mils and 20 mils.

Structure 940 is made by performing a sunken pad patterned etch that removes conductive material from the first non-conductive layer (225, 220) to create a physical and electrical separation 925 between each of the formed sunken pads 990. The sunken pads 990 have an electrically conductive layer, e.g. metal, on the sunken pad 990 bottom 985 that is continuous for each sunken pad 990 and covers 960 the walls 460 and part 982 of the surface 480.

Accordingly, the sunken pads 990 form a dual-level (950, 982), self-guiding sunken pad structure 990. The dual-level sunken pad 990 has a lower conductive surface 950 (i.e. the top surface of the conductive pad 325) and an upper conductive surface 982 partially covering the surface 480 of the card edge connector 125 (i.e. the surface 480 of the first non-conductive layer (225, 220)). Since there are two levels (950, 982) of the dual-level, self-guiding sunken pad 990, the created conductively cover groove guide walls 460 align and position the pins 470 of the external connector.

Figure 10:
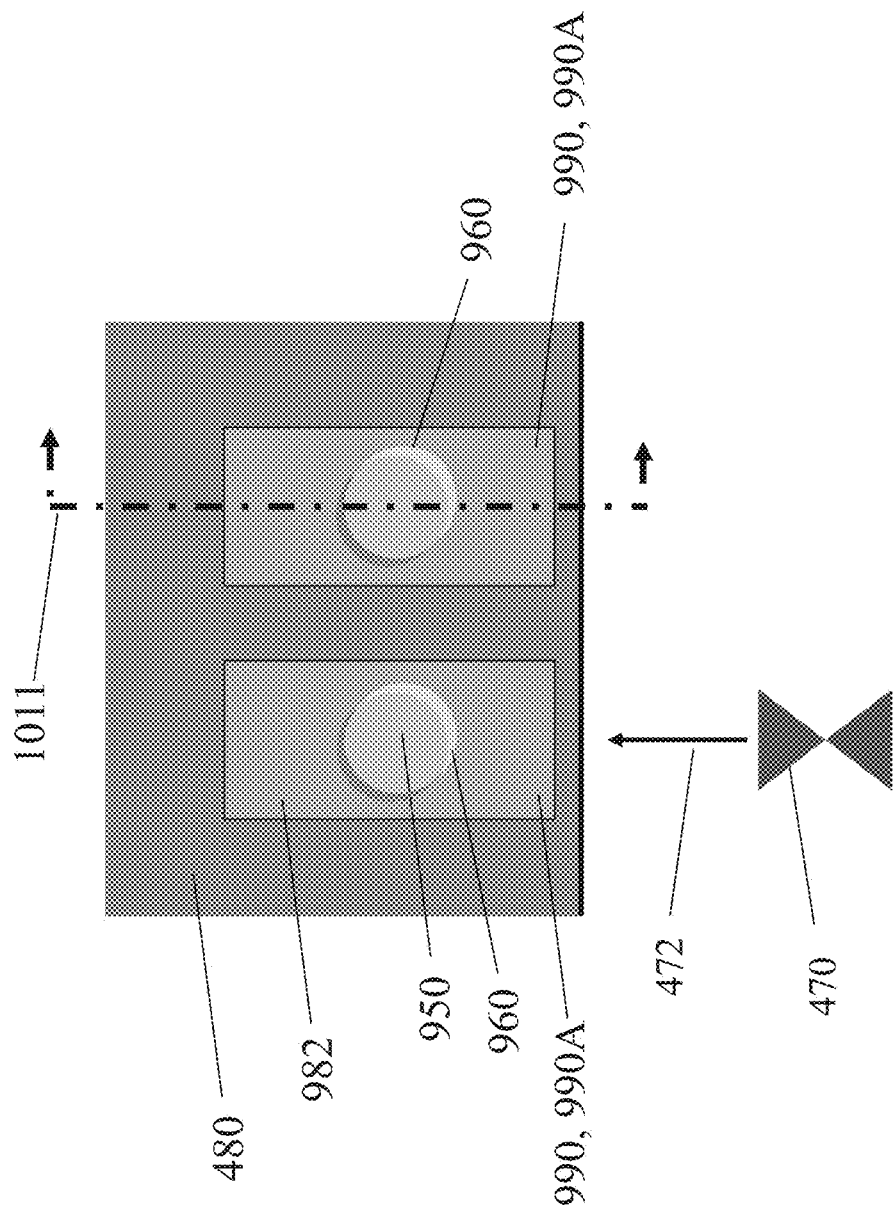
FIG. 10 is a top view of sunken pads on a printed circuit board (PCB).

Direction 1000 is the direction of the top view 1000 of the dual-level sunken pads 990 shown in FIG. 10.

FIG. 10 is a top view 1000 of two sunken pads 990, e.g. 990A and 990B, of a plurality of sunken pads 990 on a printed circuit board (PCB) 100 edge 125.

A first or upper level 982 of the conductive surface of the dual-level self-guiding sunken pad 990 is shown disposed on the surface 480 of the card edge connector 125, i.e. the surface 480 of the first non-conductive layer (225, 220). The second or lower level 950 of the dual-level self-guiding sunken pad 990, e.g. the top surface of the conductive pad 325, is shown within the upper level 982 region but at a lower level. The conductively covered walls 960 are a continuous electrically conductive part of the upper 982 and lower 950 levels. Therefore, one embodiment of the dual-level self-guiding sunken pad 990 structure is an "indented" structure where the groove guide walls 960 guide and contain the inserting 472 pin 470 so the pin (or part of the pin) is contained within and surrounded by the conductive structure (950, 960, 982).

Figure 11:
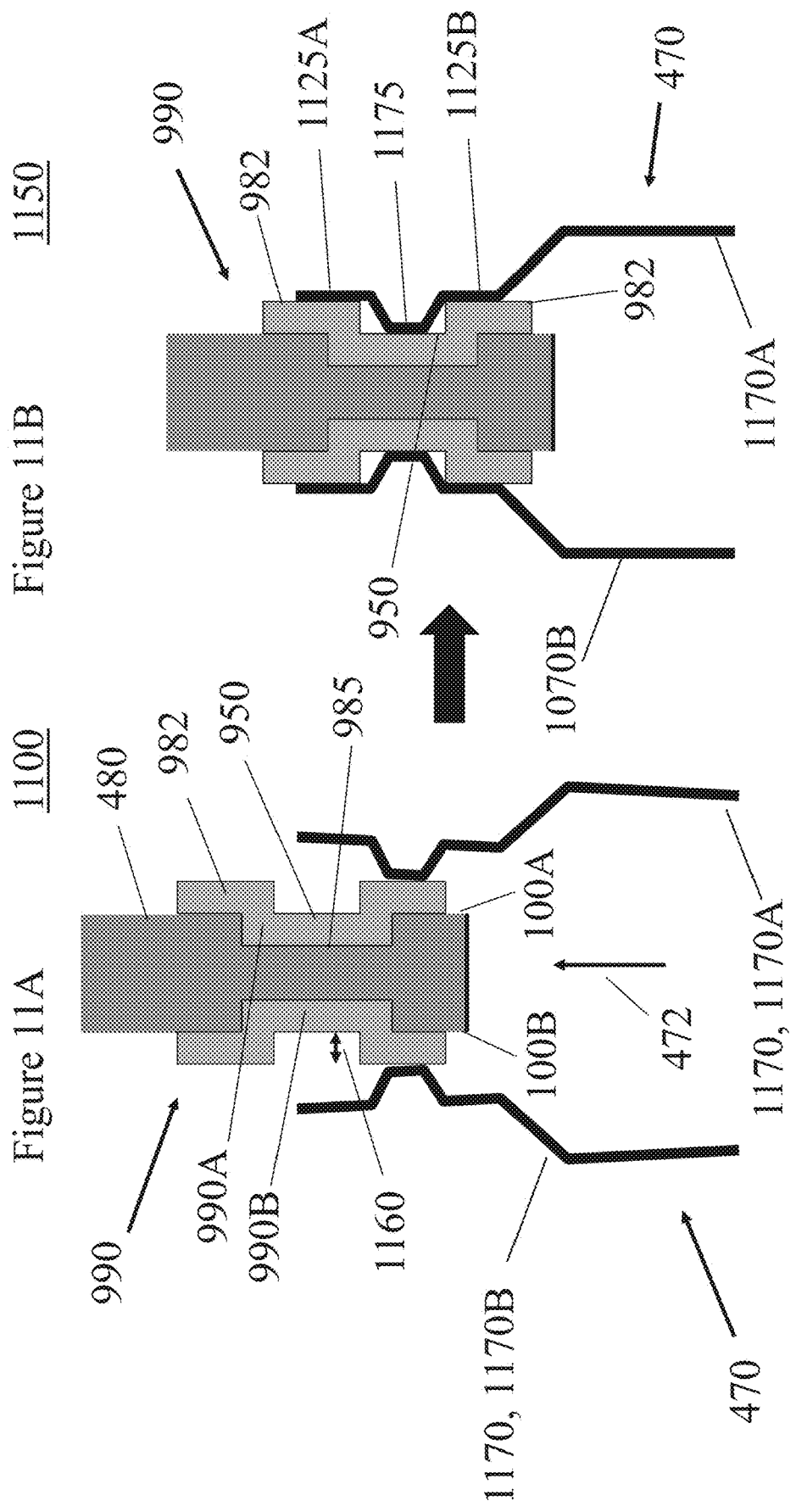
FIG. 11A is a cross section view of a dual-sided sunken pad engaging with one or more slot connections or pins.
FIG. 11B is a cross section view of a dual-sided sunken pad engaged with one or more slot connections or pins.

Cross section view 1011 is a view of the dual-level self-guiding sunken pad 990 shown in FIGS. 11A and 11B.

FIG. 11A is a cross section view 1100 of a dual-sided sunken pad 990 engaging 472 with one or more slot connections or pins (470, 1170, 1070A, 1070B).

FIG. 11B is a cross section view 1150 of the dual-sided sunken pad 990 engaged with one or more slot connections or pins (470, 1170, 1070A, 1070B).

In FIG. 11A pin 1170 has two pin parts, an upper pin 1170A and a lower pin 1170B. Upper 1170A and lower 1170B pins 1170 can be connected to the same external connection through the connector (not shown) or each connected to individual external circuits. In some embodiments the pin 1170 has only an upper pin 1170A or only a lower pin 1170B. In some embodiments, the pin(s) 1170 are encased in a slot within a (external) connector (not shown).

There are two dual-level self-guiding sunken pads 990 shown, an upper sunken pad 990A and lower sunken pad 990B. In alternative embodiments there is only the upper sunken pad 990A or the lower sunken pad 990B. In some embodiments, the upper 990A and lower 990B sunken pad 990B are the same or similar structures 990 except a first is on an upper side of the card 100 edge 125 and the other is on the lower side of the card 100 edge 125. More generally, a first (upper) dual-level pad structure 990A is on a first side (e.g. upper) 100A of the card edge 125 and/or a second (lower) dual-level pad structure 990B is on a second (lower) side 100B of the card edge 125 opposite the first dual-level pad structure 990A, if there are two pad structures 990.

The sunken pad(s) 990 and the pin(s) 1170 come together 472 either by inserting the sunken pad(s) 990 into the pin 1170, inserting the pin(s) 1170 over/onto the sunken pad(s) 990, and/or bringing both the sunken pad(s) 990 and pin(s) 1170 toward one another.

FIG. 11B shows the sunken pad(s) 990 and the pin(s) 1170 after engagement/connection 1150.

One skilled in the art given this disclosure could make the combined upper 990A and/or lower 990B sunken pads 990. For example, processes 800 and 900 can be performed on one side of the card 100 and then again on the other side of the card 100. Alternatively, during card 100 construction, e.g. making layers (225, 250), steps of processes 800 and 900 can be performed to make one of the sunken pad(s) 990 on a first side of the card 100 and then performed in a different order to make the sunken pad(s) 990 on a second side of the card 100. In alternative embodiments, there is only one group of sunken pad(s) 990 on a single side of the card 100 edge 125.

In some embodiments, during insertion/engagement/making contact (472, 1100), the pins (470, 1170, 1170A, and/or 1170B) are deflected in a spring-like motion to clear the upper conductive surface 982 of the sunken pad(s) 990.

In some embodiments, after insertion/engagement/making contact 472 is completed 1150, due to the shape of the pin(s) 1170, the pin(s) 1170 make physical and electrical contact with both the upper conductive surface 982 and lower conductive surface 950 of the corresponding/associated sunken pad(s) 990.

The pin(s) 1170 are held in place by the spring force of the pin(s) 1170. Further, the pin(s) are guided into and held in the indented structure 1175 of the sunken pad(s) 990. Since the sunken pad(s) are separated 925 physically and electrically from one another, the pin(s) 1170 corresponding/associated with the respective sunken pad 990 is (are) aligned and electrically connected to the corresponding/associate pin 1170 and the pin is physically and electrical isolated from other pins, sunken pads, and/or other contacts that would cause a malfunction.

Therefore, in some embodiments, the walls (460, 965) and upper level 982 of one or more of the dual-level pad structures 990 are covered with a conductive material 935 that is electrically and physically connected to the conductive pad 325 at the lower level 950 of the dual-level pad structure 990, where the covered wall 965, upper level 980, and conductive pad 325 of the dual-level pad structure 990 form a sunken pad structure 990. The sunken pad 990 has a sunken depth 1160 that guides and positions the pin 1170 on the sunken pad (990, 325, 950, 982).

In some embodiments the sunken depth 1160 is less than 2 times the width or diameter of the indentation.

FIG. 12 is a flow chart showing the steps of a process 1200 for forming a dual-level, self-guiding pad structures on the card edge card edge 125 connector, specifically a grooved guide 450.

The process 1200 begins with the step of a masked etching pattern 1205 to form a plurality of conductive pads 325 in the second conductive layer (315, 225) of the stack 270 of alternating conductive 250 and non-conductive 225 layers. In some embodiments, the masked etch leaves a pattern of conductive pads 325 spaced apart from one another with a uniform pitch 316. In some embodiments, the conductive pads 325 are in electrical contact with one or more of the wiring elements 370 and/or vias 360 in one or more of the conductive layers 250.

Step 1210 disposes the first or top non-conductive layer (225, 220) on the patterned second conductive layer (315, 225) covering the second non-conductive layer (225, 312) and the conductive pads 325 to form structure 330.

Step 1215 disposes the first or top conductive layer (250, 245) on the top non-conductive layer (225, 220), e.g. by plating, to form structure 340.

Step 1220 creates openings 414 in the top conductive layer (250, 245) by performing a masked pattern etch (a top conductive layer pattern etch) of the top conductive layer (250, 245) to create structure 410 with the top pattern 415.

Step 1225 performs the through/stop etch 1225 that exposes the conductive surface of the conductive pads 325 which are now in an underlayer (typically 255) of the stack 270 to form structure 420. Removing the remaining top conductive layer (250, 245), e.g. with a masked etch, creates structure 430 with a plurality of dual-level, self-guiding pad structures, i.e. grooved guides 450, on the card edge 125 connector of the card 100. In some embodiments, the removal is only done in the region 725.

The structure 430 can be created in alternative ways. For example, the pattern of conductive pads 325 can be formed by a patterned deposition of conductive material, e.g. copper on the second non-conductive layer 312. In some embodiments, one or more of the conductive pads 325 can be disposed on the exposed top of one or more vias 360. The remain structures, e.g. 330, 340, and the structures shown in FIG. 4 can be formed as described. In other alternative embodiments, one or more vias 360 can be located in/through the second conductive layer 312 a position below where one or more of the conductive pads 325 will be formed by the second conductive layer pattern etching 320 of the second conductive layer 315.

FIG. 13 is a flow chart showing the additional steps of the process 1300 for forming dual-level, self-guiding pad structures on the card edge card edge 125 connector, specifically a dual-level, self-guiding sunken pad 990 edge connector.

The process 1300 begins with step 1305 by performing the steps 1205, 1210, 1215, 1220, and the through/stop etch of step 1225 of process 1200. Alternatively, one or more conductive pads 325 can be disposed one or more vias 360, as described above.

Step 1310 performs a conformal deposition of a conductive layer on the surface 480 of the card edge connector 125 to form structure 930. The conformal deposition covers the top 480 of the card edge connector 125 (e.g. the top of the first non-conductive layer (225, 220) and the sides 460 of the groove guide 450 walls 460.

Step 1315 creates structure 940 by performing a sunken pad patterned etch that removes conductive material to create a physical and electrical separation 925 between each of the formed sunken pads 990 formed. Accordingly, a plurality of dual-level (950, 982), self-guiding sunken pad structure 990 on the card edge 125 connector of the card 100 are formed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. For example, the devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A printed circuit board (PCB) comprising:
   one or more conductive layers and one or more non-conductive layers, disposed and alternating upon one another to form a stack, one or more of the conductive layers having one or more wiring elements;
   one or more card edges; and
   a plurality of dual-level pad structures on one or more of the card edges, each of the dual-level pad structures comprising a respective groove made out of one of the non-conductive layers, being a respective groove non-conductive laver, the respective groove having a conductive pad with a conductive pad surface on a groove guide bottom of the respective groove, two or more groove guide walls made of non-conductive material of the groove non-conductive layer, and an upper level being a surface of the card edge,
   wherein at least one of the conductive pads electrically is connected to one or more of the wiring elements and wherein the groove guide walls electrically insulate the conductive pad in the respective groove from one or more other conductive pads.

2. A PCB, as in claim 1, where the groove guide walls and upper level are made of a non-conductive material.

3. A PCB, as in claim 1, where the groove guide walls and upper level are made of part of one of the non-conductive layers.

4. A PCB, as in claim 1, where at least one of the conductive pads electrically connects to one or more vias, the vias penetrating through one or more of the non-conductive layers below the conductive pad in the stack.

5. A PCB, as in claim 1, where a pitch between two adjacent dual-level pad structures is less than 0.5 millimeters (mm).

6. A PCB, as in claim 1, where the groove guide walls and conductive pad of each of the dual-level pad structures form the respective groove.

7. A PCB, as in claim 6, where a distance between the groove guide walls is the same as the respective groove is traversed from a periphery of the PCB into the PCB.

8. A PCB, as in claim 6, where a distance between the groove guide walls narrows as the respective groove is traversed from a periphery of the PCB into the PCB to form a tapered groove.

9. A PCB, as in claim 1, where the groove guide walls and upper level of one or more of the dual-level pad structures are covered with a conductive material that is electrically and physically connected to the conductive pad on the groove guide bottom of the respective groove.

10. A PCB, as in claim 9, where the covered groove guide wall, upper level, and conductive pad of the dual-level pad structure form a sunken pad structure.

11. A PCB, as in claim 9, where the conductive material is one or more of the following: a metal, copper, nickel, titanium, aluminum, platinum, tungsten, silver, and gold.

12. A PCB, as in claim 1, where a first dual-level pad structure is on a first side of the card edge and a second dual-level pad structure is on a second side of the card edge opposite the first dual-level pad structure.

13. A connection between a Printed Circuit Board (PCB) and one or more external connectors, comprising:
    a printed circuit board (PCB) comprising:
      one or more conductive layers and one or more non-conductive layers, disposed and alternating upon one another to form a stack, one or more of the conductive layers having one or more wiring elements;
      one or more card edges; and
      a plurality of dual-level pad structures on one or more of the card edges, the dual-level pad structures comprising a groove made out of one of the non-conductive layers, being a groove non-conductive laver, the groove having a conductive pad with a conductive pad surface on a groove guide bottom of the groove, groove guide walls made of non-conductive material of the groove non-conductive layer, and an upper level being a surface of the card edge;
    one or more pins, each of one or more of the pins associated with one of the dual-level pad structures, being an associated connection, where the pin in the associated connection is aligned to physically and electrically connect with the conductive pad surface in the dual-level pad structure in the associated connection and the pin in the associated connection is electrically insulated by the groove guide walls to be not able to electrically connect with another pin or another conductive pad.

14. A connection, as in claim 13, where the groove guide walls, upper level, and conductive pad of the dual-level pad structure in the associated connection form a groove with a groove depth, the pin in the associated connection is aligned by the groove guide walls to make spring contact with the conductive surface of the conductive pad, and the pin is electrically insulated from other electrical contacts by the non-conductive material making the groove guide walls and upper level.

15. A connection, as in claim 14, where a groove width divided by the groove depth is an aspect ratio between 2 to 1 and 1 to 3.

16. A connection, as in claim 13, where one or more of the groove guide walls guiding the pin is tapered.

17. A connection, as in claim 13, where the groove guide walls and upper level of one or more of the dual-level pad structures are covered with a conductive material that is electrically and physically connected to the conductive pad at the groove guide bottom of the groove of the dual-level pad structure, where the covered wall, upper level, and conductive pad of the dual-level pad structure form a sunken pad structure, wherein the sunken pad structure has a sunken depth that guides and positions the pin on the sunken pad.

18. A Printed Circuit Board (PCB) comprising:
one or more conductive layers and one or more non-conductive layers, disposed and alternating upon one another to form a stack, one or more of the conductive layers having one or more wiring elements;
one or more card edges; and
a plurality of dual-level pad structures on one or more of the card edges, the dual-level pad structures comprising a groove made out of one of the non-conductive layers, being a groove non-conductive layer, the groove having a conductive pad with a conductive pad surface on a groove guide bottom of the groove, groove guide walls made of non-conductive material of the groove non-conductive layer, and an upper level being a surface of the card edge, at least one of the conductive pads electrically connecting to one or more of the wiring elements;
a conductive material electrically and physically connected to the conductive pad surface, the conductive material covering the groove guide walls and the upper level of the dual-level pad structure and creating a sunken pad structure in each of the dual-level pad structures; and
one or more electrical separations where the conductive material on the upper level is removed between each of the sunken pad structures.

19. The PCB, as in claim 18, where the conductive surface of the conductive pad is indented with an indentation.

20. The PCB, as in claim 19, where a depth of the indentation is less than 2 times a width of the indentation.

* * * * *